US008692390B2

(12) United States Patent
Wu et al.

(10) Patent No.: US 8,692,390 B2
(45) Date of Patent: Apr. 8, 2014

(54) PYRAMID BUMP STRUCTURE

(75) Inventors: Chih-Hung Wu, Zhubei (TW); Lung-Hua Ho, Hsinchu (TW); Chih-Ming Kuo, Xingfeng Township, Hsinchu County (TW); Cheng-Hung Shih, Lugang Township, Changhua County (TW); Yie-Chuan Chiu, Hsinchu (TW)

(73) Assignee: Chipbond Technology Corporation, Hsinchu (TW)

( * ) Notice: Subject to any disclaimer, the term of this patent is extended or adjusted under 35 U.S.C. 154(b) by 448 days.

(21) Appl. No.: 13/030,203

(22) Filed: Feb. 18, 2011

(65) Prior Publication Data

US 2012/0211257 A1 Aug. 23, 2012

(51) Int. Cl.
*H01L 29/40* (2006.01)

(52) U.S. Cl.
USPC .......................................... 257/778; 257/783

(58) Field of Classification Search
USPC ................................................ 257/778, 783
See application file for complete search history.

(56) References Cited

U.S. PATENT DOCUMENTS

| 5,600,180 | A  | * | 2/1997  | Kusaka et al. ............... 257/692 |
| 6,002,180 | A  | * | 12/1999 | Akram et al. ................ 257/783 |
| 6,054,171 | A  | * | 4/2000  | Shoji .............................. 438/106 |
| 6,396,156 | B1 | * | 5/2002  | Tang et al. ..................... 257/779 |
| 7,105,433 | B2 | * | 9/2006  | Tsai et al. ...................... 438/613 |
| 7,170,171 | B2 | * | 1/2007  | Grigg ............................. 257/737 |
| 7,323,779 | B2 | * | 1/2008  | Ibaraki ........................... 257/737 |
| 7,557,452 | B1 | * | 7/2009  | Williams et al. ............... 257/778 |
| 7,749,806 | B2 | * | 7/2010  | Shen et al. ..................... 438/108 |
| 8,258,055 | B2 | * | 9/2012  | Hwang et al. ................. 438/613 |
| 8,441,124 | B2 | * | 5/2013  | Wu et al. ........................ 257/737 |
| 2005/0208704 | A1 | * | 9/2005  | Akram et al. ................ 438/108 |
| 2005/0253232 | A1 | * | 11/2005 | Ibaraki .......................... 257/678 |
| 2006/0017175 | A1 | * | 1/2006  | Akram et al. ................ 257/780 |
| 2006/0022340 | A1 | * | 2/2006  | Ho et al. ........................ 257/750 |
| 2006/0057833 | A1 | * | 3/2006  | Kim et al. ..................... 438/612 |
| 2007/0037319 | A1 | * | 2/2007  | Chan et al. .................... 438/108 |
| 2008/0203567 | A1 | * | 8/2008  | Kondo ........................... 257/738 |
| 2008/0251940 | A1 |   | 10/2008 | Lee et al.                          |
| 2010/0190293 | A1 | * | 7/2010  | Maeda et al. ................. 438/108 |
| 2010/0193950 | A1 | * | 8/2010  | Lee et al. ....................... 257/738 |

(Continued)

FOREIGN PATENT DOCUMENTS

TW          464927     11/2001
TW    200845254 A    11/2008

OTHER PUBLICATIONS

Taiwanese Office Action mailed Jun. 27, 2013 for Taiwanese Patent Application No. 099146159, 5 pages.

*Primary Examiner* — James Mitchell
(74) *Attorney, Agent, or Firm* — Jackson IPG PLLC

(57) ABSTRACT

A pyramid bump structure for electrically coupling to a bond pad on a carrier comprises a conductive block disposed at the bond pad and an oblique pyramid insulation layer covered at one side of the conductive block. The oblique pyramid insulation layer comprises a bottom portion and a top portion, and outer diameter of the oblique pyramid insulation layer is tapered from the bottom portion to the top portion. When the carrier is connected with a substrate and an anisotropic conductive film disposed at the substrate, the pyramid bump structure may rapidly embed into the anisotropic conductive film to raise the flow rate of the anisotropic conductive film. Further, a short phenomenon between adjacent bumps can be avoided to raise the yield rate of package process.

6 Claims, 13 Drawing Sheets

(56) References Cited

U.S. PATENT DOCUMENTS

| | | | |
|---|---|---|---|
| 2011/0049705 A1* | 3/2011 | Liu et al. | 257/737 |
| 2011/0101523 A1* | 5/2011 | Hwang et al. | 257/737 |
| 2011/0285011 A1* | 11/2011 | Hwang et al. | 257/737 |
| 2011/0298123 A1* | 12/2011 | Hwang et al. | 257/737 |
| 2011/0309481 A1* | 12/2011 | Huang et al. | 257/659 |
| 2012/0007231 A1* | 1/2012 | Chang | 257/737 |
| 2012/0091577 A1* | 4/2012 | Hwang et al. | 257/737 |
| 2012/0178251 A1* | 7/2012 | Lim et al. | 438/613 |

* cited by examiner

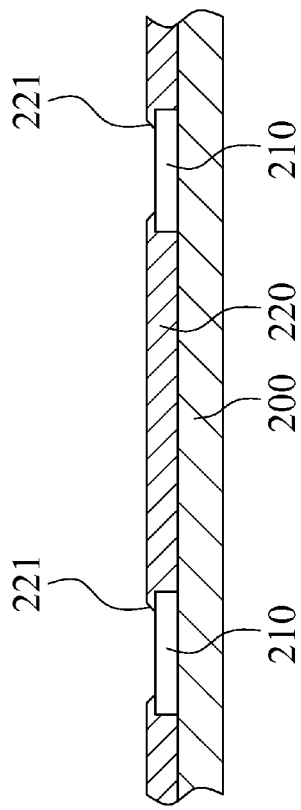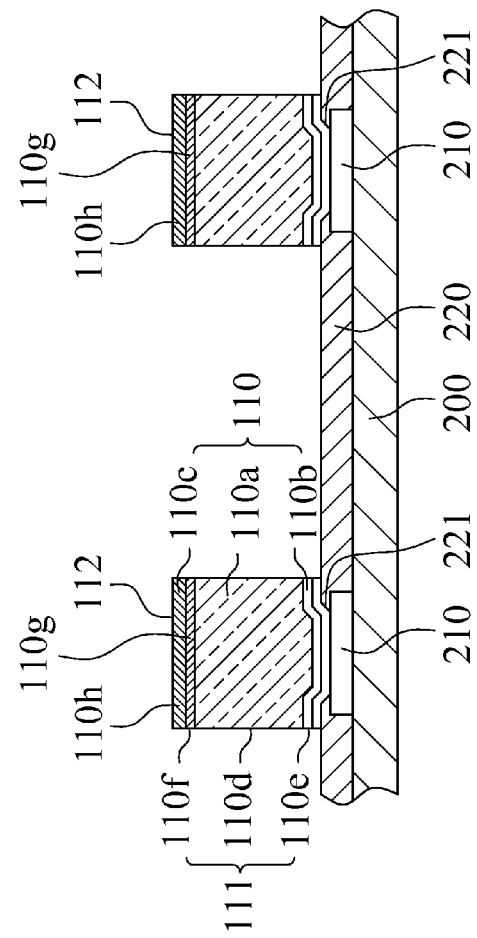

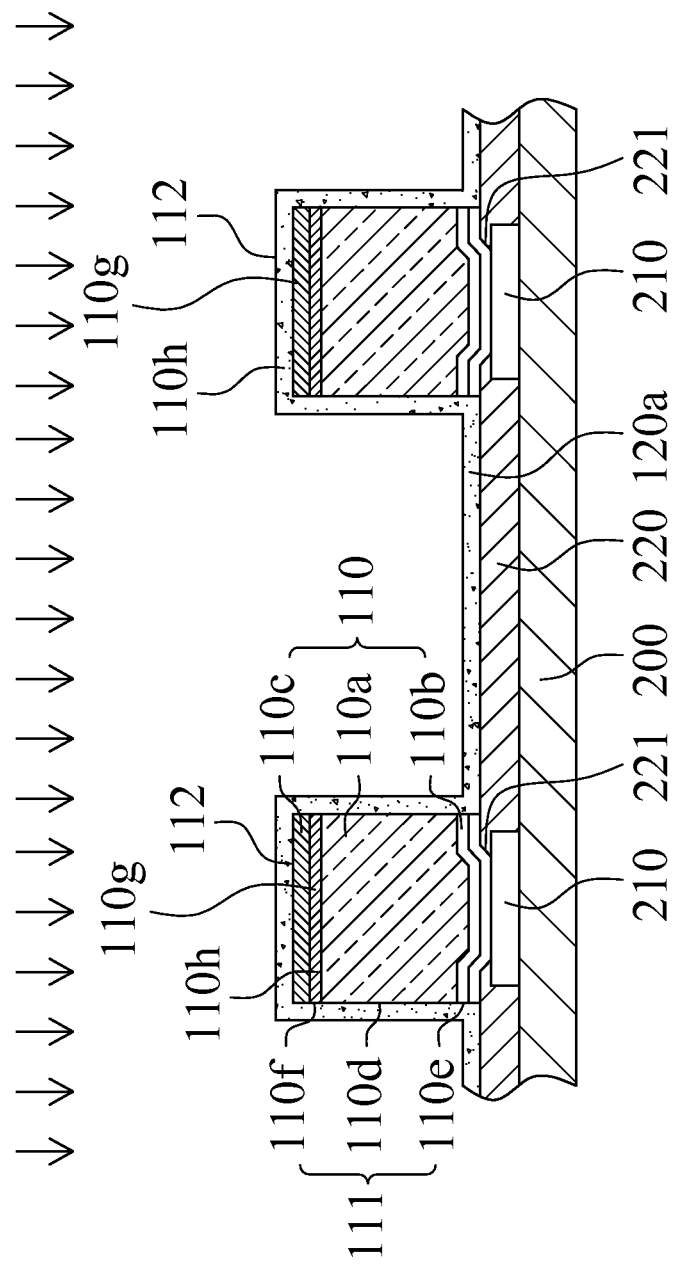

PYRAMID BUMP STRUCTURE

FIELD OF THE INVENTION

The present invention is generally relating to a pyramid bump structure. More particularly, the pyramid bump structure may increase the flow rate and prevent the short phenomenon between adjacent bumps to improve yield rate in the lamination process.

BACKGROUND OF THE INVENTION

With the following progress and requirement in modern society, future electronic products must meet the standard aimed for high-speed process, multi-function, high-integration, thin, small, and lower cost. Therefore, the development of package technology is moving toward a trend of microminiaturization and high density. The frequent-used package technology comprises Ball Grid Array (BGA), Chip-Scale Package (CSP), Flip Chip (F/C), Multi-Chip Module (MCM) and so on.

With reference to FIG. 1, a conventional flip-chip package technology allocates a plurality of bond pads 11 onto an active surface 12 of a chip 10 in the arrangement of area array, thereafter forms a plurality of bumps 20 on each of the bond pads 11 and flips the chip 10. Next, the bumps 20 are electrically and mechanically connected with a plurality of mounting pads 31 of a substrate 30 (such as glass substrate, ceramic substrate or printed circuit board). Referring to FIGS. 2 and 3, in the process of conventional flip-chip package, an anisotropic conductive paste 40 can be disposed on the substrate 30. The bumps 20 may contact and extrude the anisotropic conductive paste 40 to force mentioned conductive paste 40 to flow from the bottom to the outside of the bumps 20. As a result, the extruded anisotropic conductive paste 40 is filled between the chip 10, the substrate 30 and adjacent bumps 20. However, the anisotropic conductive paste 40 is composed of a colloid 41 and a plurality of conductive particles 42. When the extruded anisotropic conductive paste 40 flows from the bottom to the outside of the bumps 20, those conductive particles 42 may gather between adjacent bumps 20 to lead a short phenomenon between the conductive particles 42 and adjacent bumps 20. Accordingly, the yield rate of the package process will be significantly influenced.

SUMMARY

The primary object of the present invention is to provide a pyramid bump structure for electrically coupling to a bond pad disposed on a carrier, wherein the pyramid bump structure comprises a conductive block and an oblique pyramid insulating layer. The conductive block is disposed on the bond pad of the carrier. A lateral surface of the conducting block is covered by the oblique pyramid insulating layer. The oblique pyramid insulating layer comprises a bottom portion adjacent to the carrier and a top portion positioned above the bottom portion, and outer diameter of the oblique pyramid insulating layer is tapered from the bottom portion to the top portion. When the carrier is laminated by a substrate and an anisotropic conductive paste disposed on the substrate, for the reason that outer diameter of the oblique pyramid insulating layer is tapered from the bottom portion to the top portion, the pyramid bump structure may rapidly embed into the anisotropic conductive paste to increase the flow rate of the anisotropic conductive paste.

The secondary object of the present invention is to provide a pyramid bump structure. When the carrier is laminated by the substrate and the anisotropic conductive paste, a plurality of conductive particles of the anisotropic conductive paste is extruded by the pyramid bump structure to force mentioned conductive particles to gather between adjacent pyramid bumps. For the reason that the lateral surface of the conductive block is covered by the oblique pyramid insulating layer, a short phenomenon between the conductive particles and each of the pyramid bump structures can be avoided to raise the yield rate of package process.

DESCRIPTION OF THE DRAWINGS

FIG. 8A to 8E are schematic diagrams illustrating the process of the pyramid bump structure in accordance with a preferred embodiment of the present invention.

DETAILED DESCRIPTION OF THE INVENTION

Figure 1:
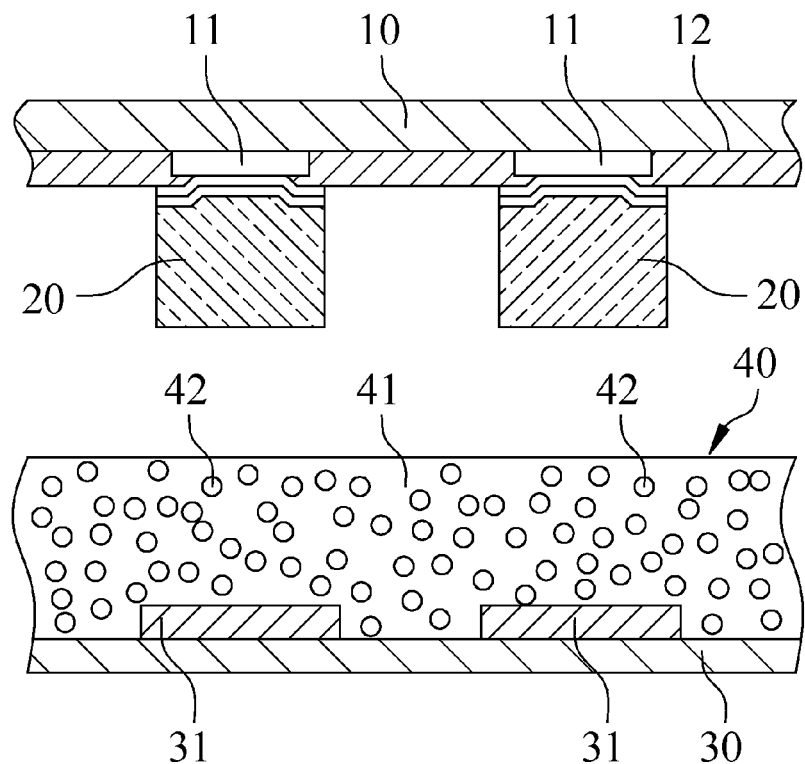
FIG. 1 is a schematic diagram illustrating a chip and a substrate before connection in conventional flip-chip package technology.
Figure 2:
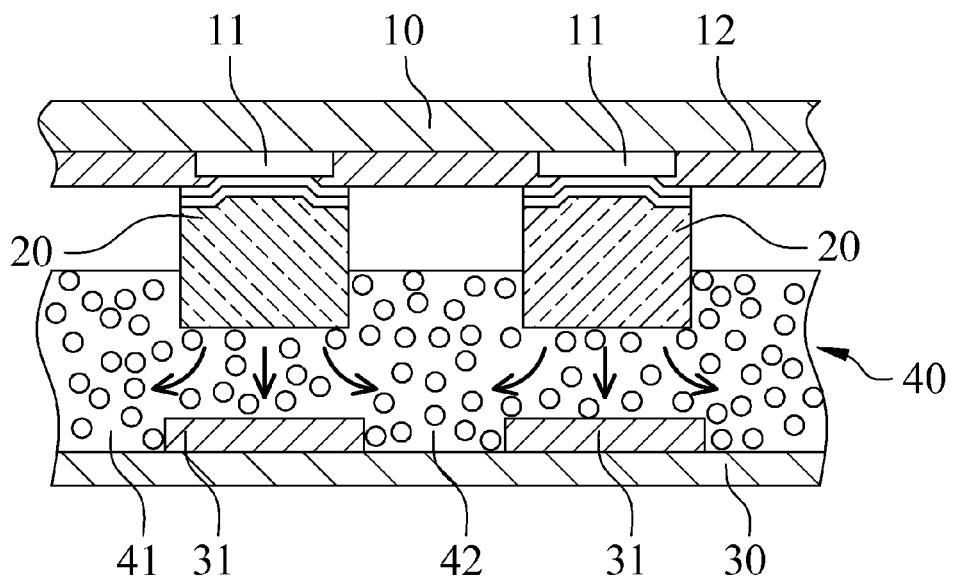
FIG. 2 is a schematic diagram illustrating a connection between the chip and an anisotropic conductive paste disposed on the substrate in conventional flip-chip package technology.
Figure 3:
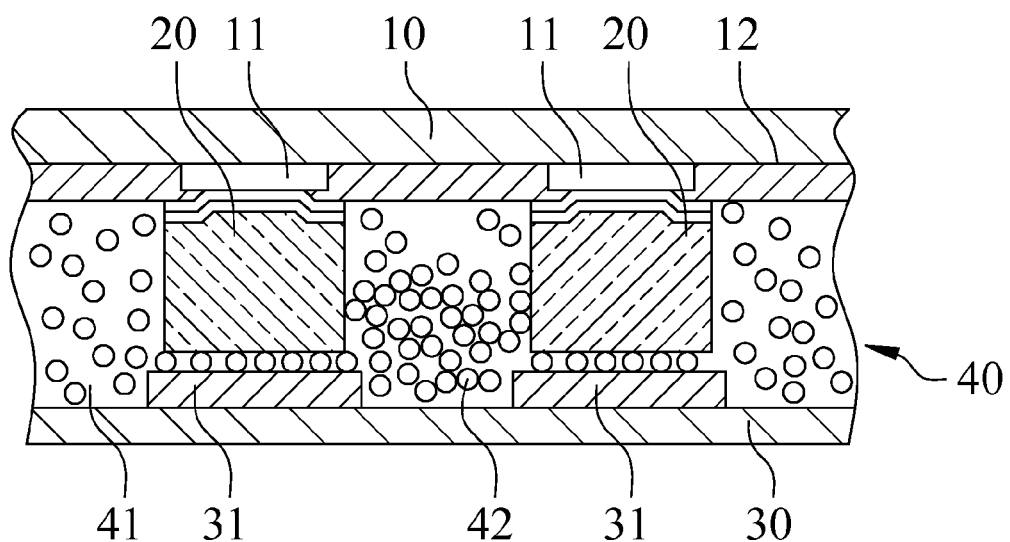
FIG. 3 is a schematic diagram illustrating the connection between the chip and the substrate in conventional flip-chip package technology.
Figure 4:
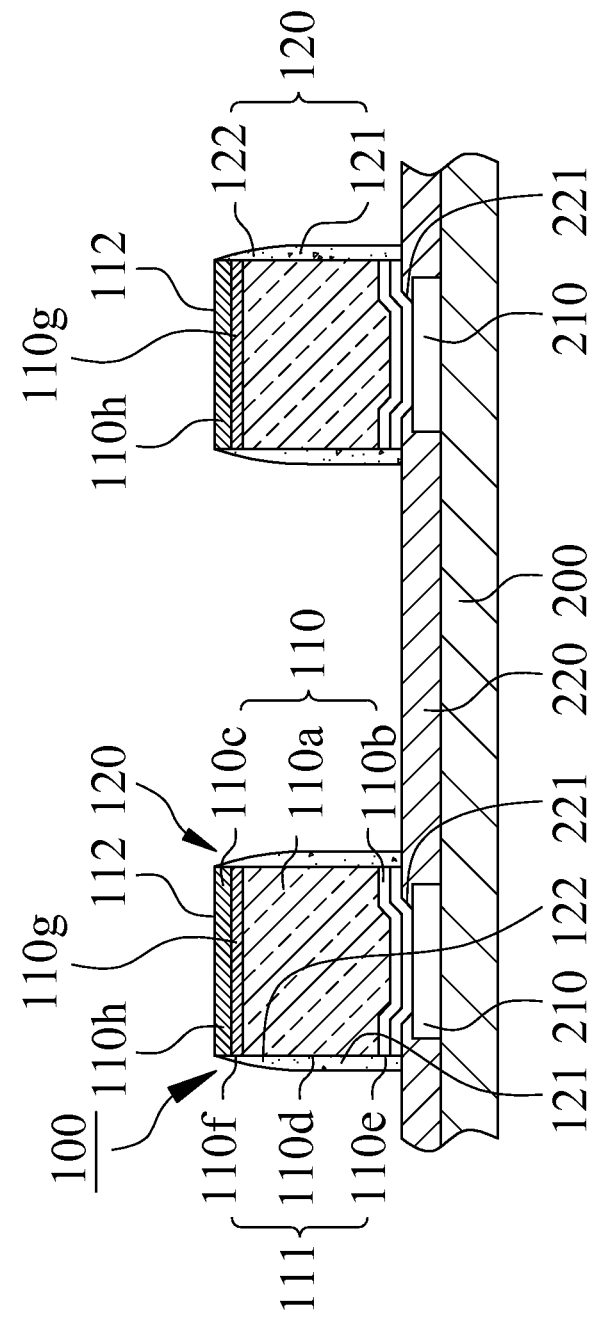
FIG. 4 is a section view illustrating a pyramid bump structure in accordance with a preferred embodiment of the present invention.
Figure 5:
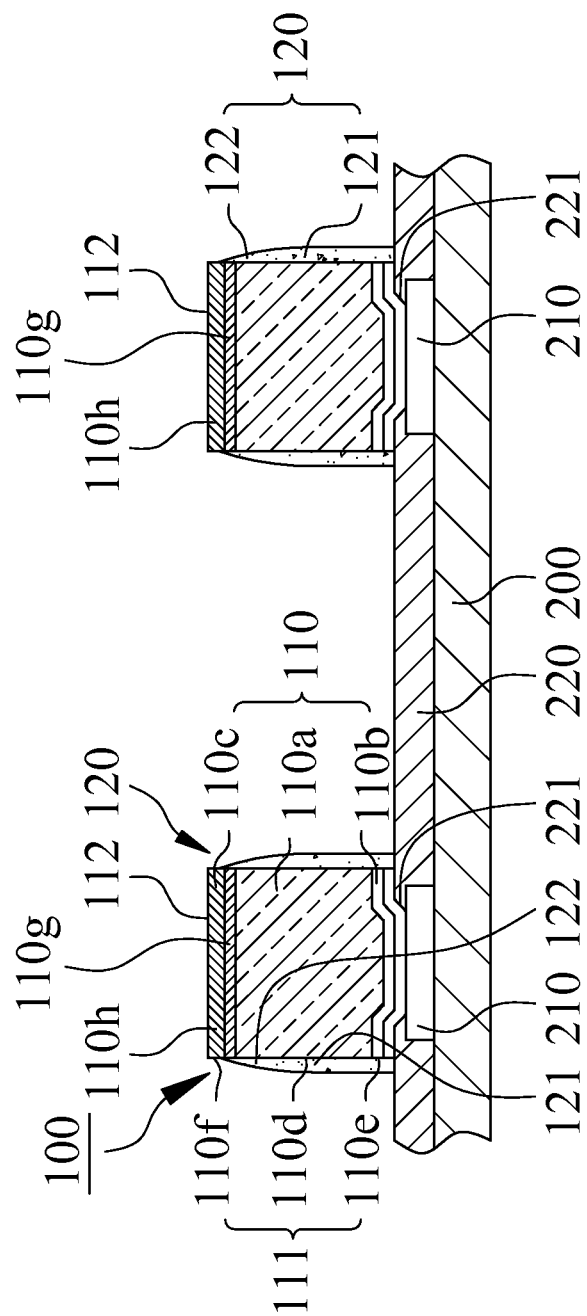
FIG. 5 is a section view illustrating the pyramid bump structure in accordance with another preferred embodiment of the present invention.
Figure 6:
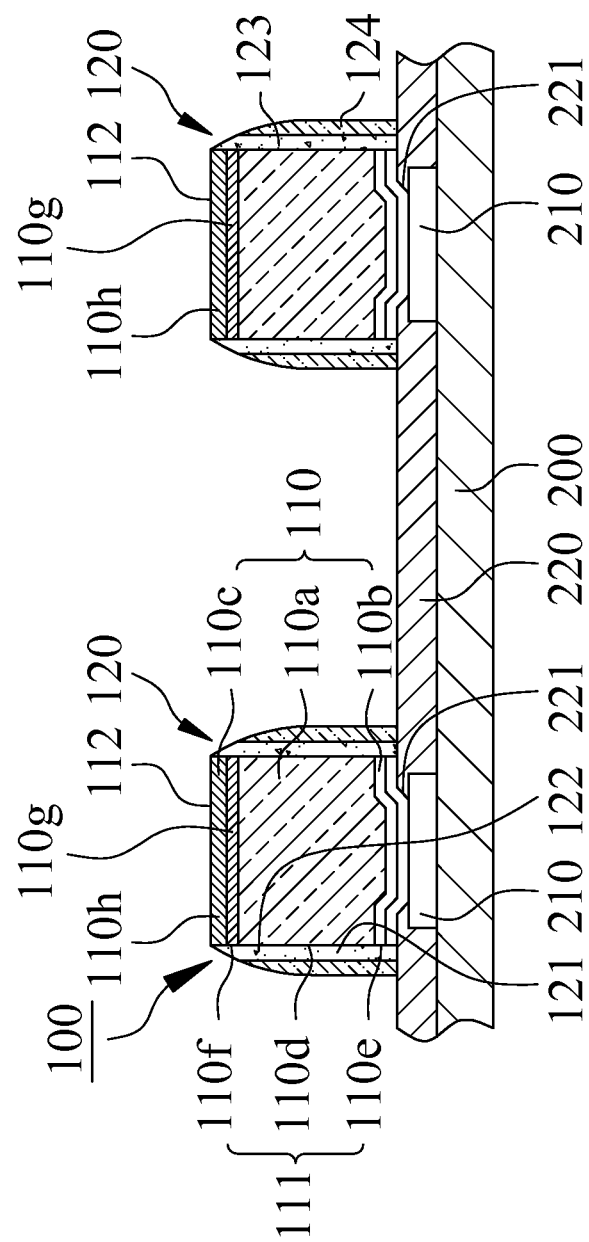
FIG. 6 is a section view illustrating the pyramid bump structure in accordance with another preferred embodiment of the present invention.
Figure 7:
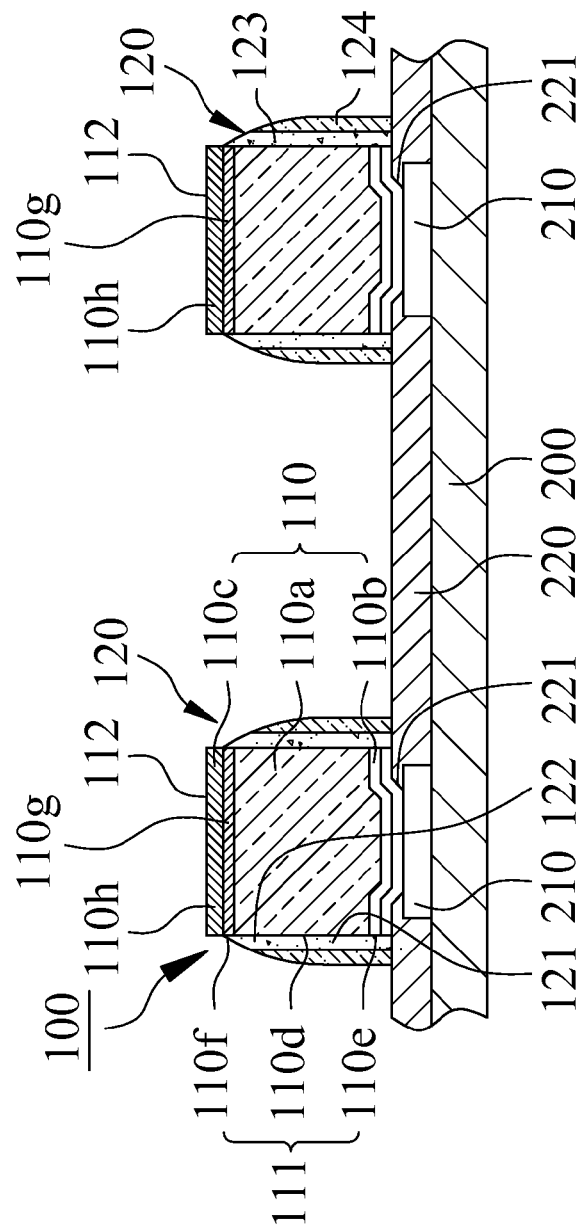
FIG. 7 is a section view illustrating the pyramid bump structure in accordance with another preferred embodiment of the present invention.
Figure 8C:
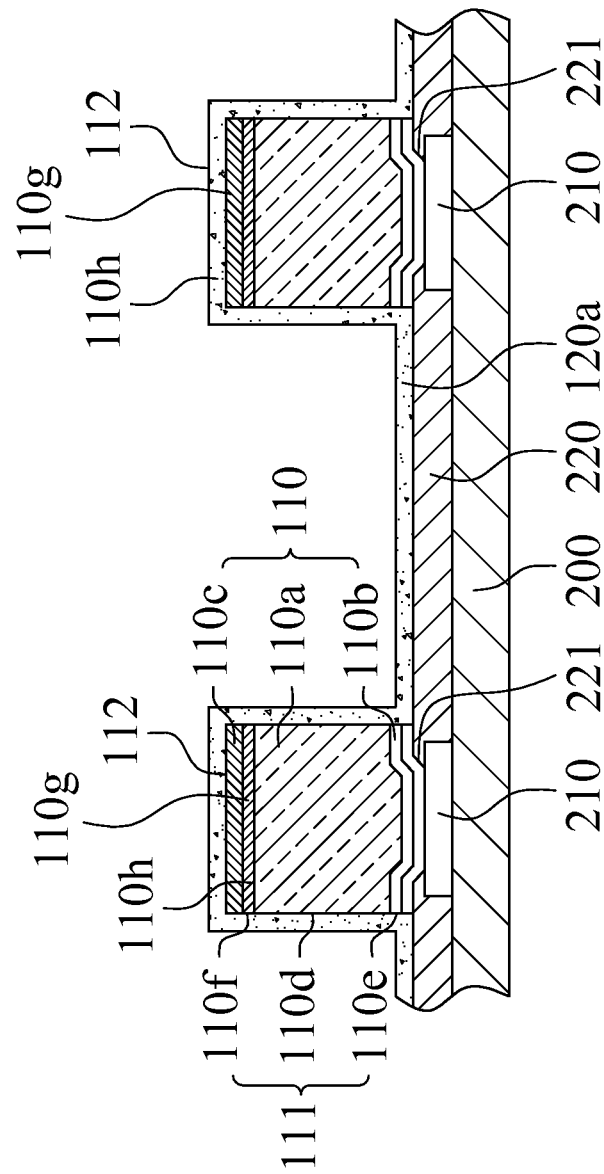
Figure 8E:
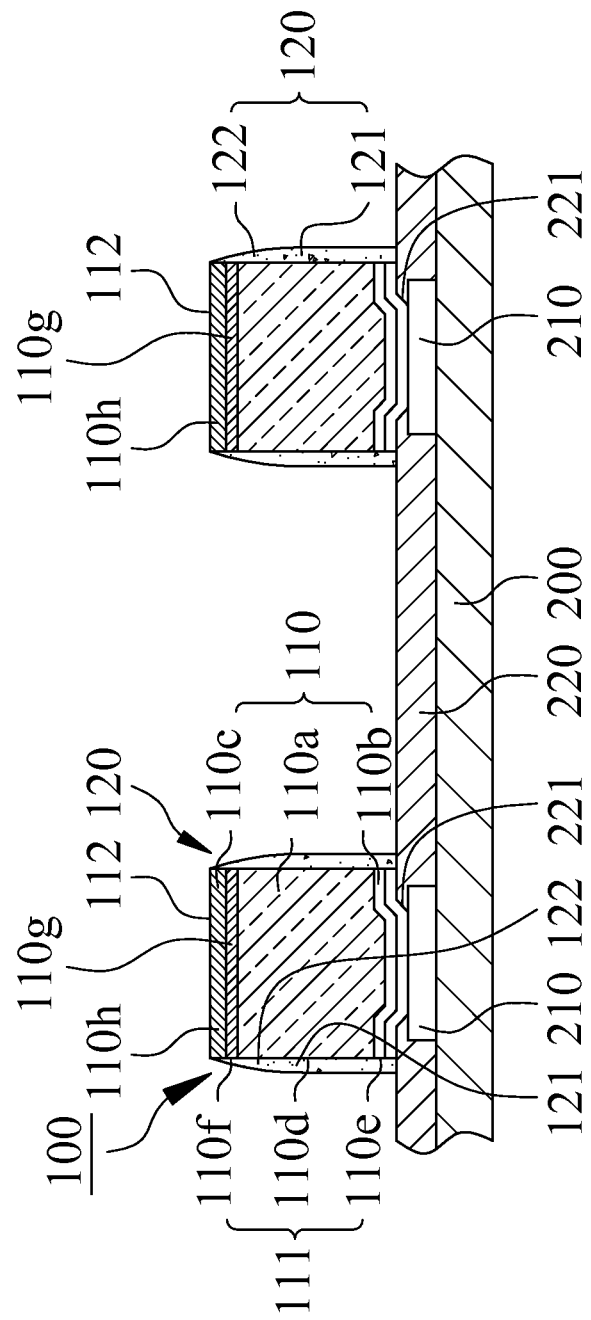

With reference to FIG. 4, a pyramid bump structure 100 disposed on a carrier 200 in accordance with a preferred embodiment of the present invention, wherein the carrier 200 comprises a plurality of bond pads 210 and a protecting layer 220. The pyramid bump structure 100 is electrically coupled to the bond pad 210. The protecting layer 220 comprises a plurality of openings 221, and the openings 221 reveal the bond pads 210. The pyramid bump structure 100 is electrically connected with the bond pad 210 and at least comprises a conductive block 110 and an oblique pyramid insulating layer 120. The conductive block 110 is disposed at the bond pad 210 of the carrier 200 and comprises a lateral surface 111 and a top surface 112. The lateral surface 111 of the conductive block 110 is covered by the oblique pyramid insulating layer 120, the oblique pyramid insulating layer 120 comprises a bottom portion 121 adjacent to the carrier 200 and a top portion 122 positioned above the bottom portion 121, wherein outer diameter of the oblique pyramid insulating layer 120 is tapered from the bottom portion 121 to the top portion 122. In this embodiment, the conductive block 110 comprises a main body 110a, an under bump metallurgy layer 110b and a connecting layer 110c, wherein the main body 110a is located between the under bump metallurgy layer 110b and the connecting layer 110c. Besides, the main body 110a is made of copper. The under bump metallurgy layer 110b of the conductive block 110 is electrically connected with the bond pad 210. The main body 110a comprises a first ring wall 110d, the under bump metallurgy layer 110b comprises a second ring wall 110e, and the connecting layer 110c comprises a third ring wall 110f. In this embodiment, the lateral surface 111 is composed of the first ring wall 110d, the second ring wall 110e and the third ring wall 110f. Or, in another embodiment, the lateral surface 111 is simply composed of the first ring wall 110d and the second ring wall 110e. Or, in another embodiment, the lateral surface 111 can merely be the first ring wall 110d. In this embodiment, the oblique pyramid insulating layer 120 at least covers the first ring wall 110d of the main body 110a and the second ring wall 110e of the under bump metallurgy layer 110b. The connecting layer 110c comprises a nickel layer 110g and a gold layer 110h, and the nickel layer 110g is located between the main body 110a and the gold layer 110h. With reference to FIG. 5, in another embodiment, the oblique pyramid insulating layer 120 reveals the gold layer 110h. Referring to FIG. 6, in another embodiment, the oblique pyramid insulating layer 120 comprises an oxide layer 123 and a nitride layer 124, wherein the oxide layer 123 is located between the conductive block 110 and the nitride layer 124. With reference to FIG. 7, in another embodiment, the oxide layer 123 and the nitride layer 124 reveal the gold layer 110h.

With reference to FIGS. 8A to 8E, FIG. 8A to 8E represents a manufacturing process of the pyramid bump structure 100. First, referring to FIG. 8A, providing a carrier 200, the carrier 200 can be a silicon substrate, glass substrate or ceramic substrate. In this embodiment, the carrier 200 comprises a plurality of bond pads 210 and a protecting layer 220. The protecting layer 220 comprises a plurality of openings 221, the openings 221 reveals the bond pads 210, and the bond pads 210 are made of Aluminum. Next, referring to FIG. 8B, to form an under bump metallurgy layer 110b onto each of the bond pads 221. The under bump metallurgy layer 110b comprises a second ring wall 110e, and a main body 110a is formed on the under bump metallurgy layer 110b and comprises a first ring wall 110d. In this embodiment, the main body 110a is made of copper. Preferably, a connecting layer 110c may be formed on the main body 110a and the main body 110a comprises a third ring wall 110f. The connecting layer 110c further comprises a nickel layer 110g and a gold layer 110h. A conductive block 110 is composed of the main body 110a, the under bump metallurgy layer 110b and the connecting layer 110c. The conductive block 110 comprises a lateral surface 111 and a top surface 112, in this embodiment, the lateral surface 111 is composed of the first ring wall 110d, the second ring wall 110e and the third ring wall 110f. Or, in another embodiment, the lateral surface 111 is simply composed of the first ring wall 110d and the second ring wall 110e. Or, in another embodiment, the lateral surface 111 can merely be the first ring wall 110d. Thereafter, with reference to FIG. 8C, forming an insulating layer 120a on the carrier 200, the protecting layer 220, the lateral surface 111 and the top surface 112 of the conductive block 110 are covered by the insulating layer 120a. The forming method of the insulating layer 120a may be Chemical Vapor Deposition, and the insulating layer 120a can be made by one of oxide, nitride or dielectric materials. Eventually, referring to FIGS. 8D and 8E, applying plasma etching to remove the insulating layer 120a which covers the protecting layer 220 and the conductive block 110 to reveal the gold layer 110h, and enables the insulating layer 120a which covers the lateral surface 111 of the conductive block 110 to form the oblique pyramid insulating layer 120 (with reference to FIG. 8E). The oblique pyramid insulating layer 120 comprises a bottom portion 121 adjacent to the carrier 200 and a top portion 122 positioned above the bottom portion 121, wherein outer diameter of the oblique pyramid insulating layer 120 is tapered from the bottom portion 121 to the top portion 122. The pyramid bump structure 100 is composed of the conductive block 110 and the oblique pyramid insulating layer 120, wherein the lateral surface 111 of the conductive block 110 is covered by the oblique pyramid insulating layer 120.

Figure 9A:
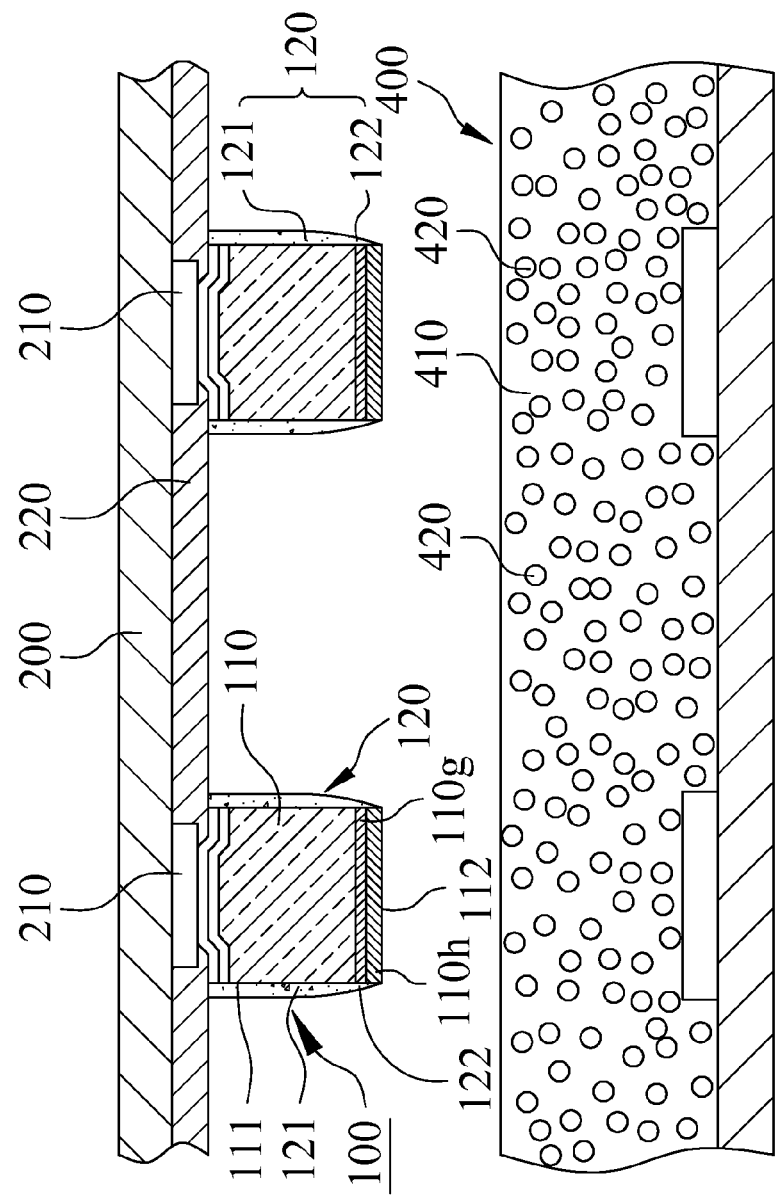
FIG. 9A to 9C are flow diagrams illustrating the connection between a substrate and a carrier having the pyramid bump structure disposed thereon in accordance with a preferred embodiment of the present invention.
Figure 9B:
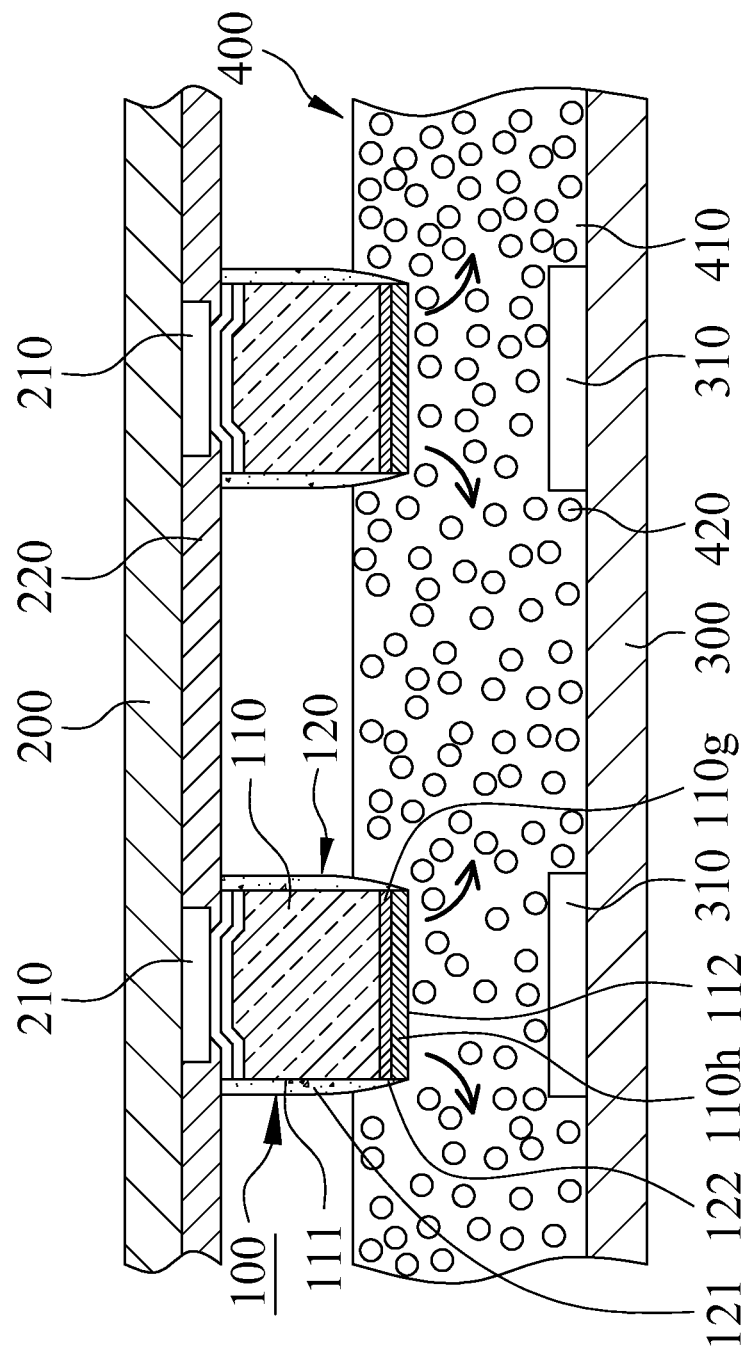
Figure 9C:
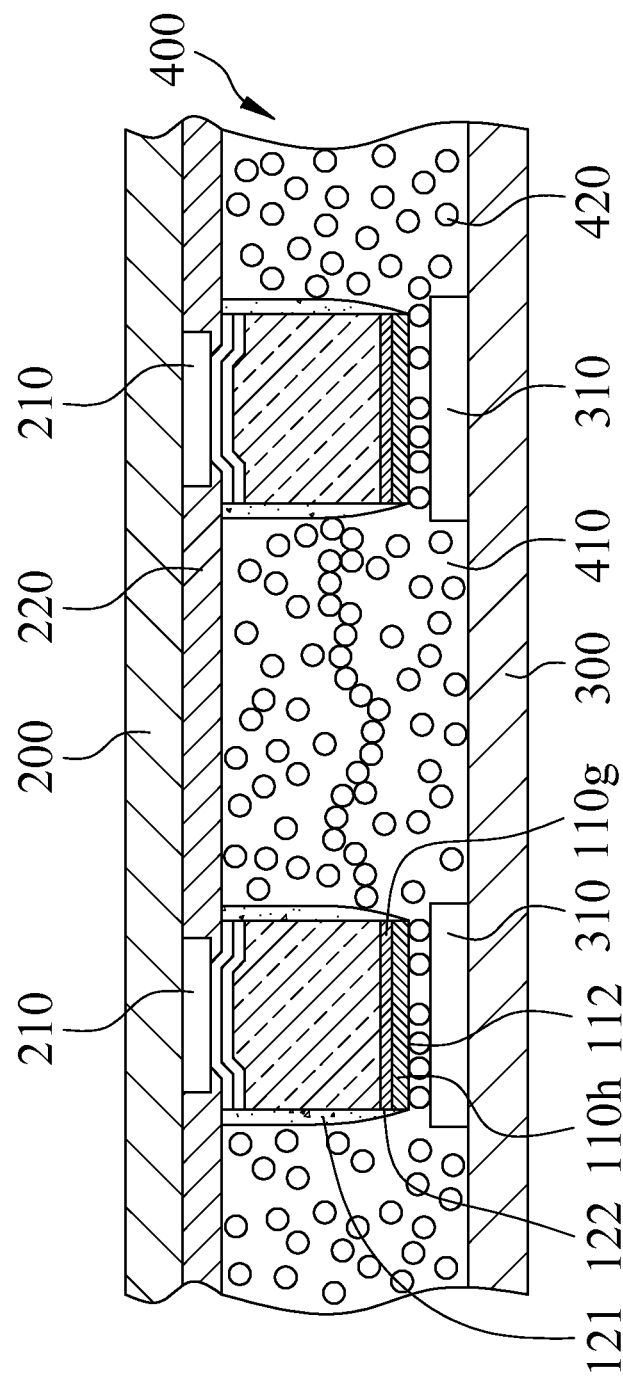

With reference to FIG. 9A to 9C, FIG. 9A to 9C represent flow diagrams illustrating the connection between the carrier 200 having a plurality of pyramid bump structures 100 disposed thereon and the mounting pads 310 of the substrate 300. First, with reference to FIG. 9A, when the carrier 200 is coupled to the substrate 300 via the pyramid bump structure 100, an anisotropic conductive paste 400 is disposed on the substrate 300. Generally, the anisotropic conductive paste 400 composed of a colloid 410 and a plurality of conductive particles 420 is a thin film in B-STAGE colloidal state. The colloid 410 can be filled between the carrier 200 and the substrate 300 and is possessed of functions as humidity prevention, bonding, heat-resistant and insulation. The conductive particles 420 are utilized for connection between the pyramid bump structures 100 and the mounting pads 310. Next, with reference to FIG. 9B, when the pyramid bump structure 100 contacts against the anisotropic conductive paste 400, the pyramid bump structure 100 may rapidly embed into the anisotropic conductive paste 400 via gradual contraction from the bottom portion 121 to the top portion 122. Besides, the anisotropic conductive paste 400 is flowable in certain temperature environment, by means of tapered shape of the oblique pyramid insulating layer 120, the flow rate of the anisotropic conductive paste 400 can be raised therefore enabling the anisotropic conductive paste 400 to be rapidly filled in between the carrier 200 and the substrate 300. Eventually, with reference to FIG. 9C, when the pyramid bump structure 100 disposed on the carrier 200 contacts against the anisotropic conductive paste 400, the conductive particles 420 of the anisotropic conductive paste 400 may gather between adjacent bumps 100. In this embodiment, for the reason that the lateral surface 111 of the conductive block 110 is covered by the oblique pyramid insulating layer 120, a short phenomenon between adjacent pyramid bump structures 100 caused by gathering of the conductive particles 420 can be prevented to raise the yield rate of package process.

While this invention has been particularly illustrated and described in detail with respect to the preferred embodiments thereof, it will be clearly understood by those skilled in the art that is not limited to the specific feature shown and described and various modifications and changes in form and details may be made without departing from the spirit and scope of this invention.

What is claimed is:

1. A pyramid bump structure electrically coupling to a bond pad disposed on a carrier, wherein the pyramid bump structure comprises:

a conductive block comprising a main body, an under bump metallurgy layer defining a first ring wall, and a connecting layer defining a second ring wall wherein the main body is arranged between the under bump metallurgy layer and the connecting layer and wherein the conductive block has a lateral surface and a top surface, wherein the conductive block is disposed on the bond pad of the carrier and wherein the under bump metallurgy layer of the conductive block electrically connects the main body with the bond pad; and an oblique pyramid insulating layer comprises a bottom portion adjacent to the carrier and a top portion positioned above the bottom portion, wherein an outer diameter of the oblique pyramid insulating layer is tapered from the bottom portion to the top portion and wherein the oblique pyramid insulating layer covers at least the first and second ring walls such that, due to the taper of the oblique pyramid insulating layer, the pyramid bump structure rapidly embeds into an anisotropic conductive paste applied to mounting pads and a substrate so as to increase a flow rate of the anisotropic conductive paste as the pyramid bump structure is brought into adjacency with the mounting pads and substrate.

2. The pyramid bump structure in accordance with claim 1, wherein the main body is made of copper.

3. The pyramid bump structure in accordance with claim 1, wherein the connecting layer comprises a nickel layer and a gold layer, the nickel layer is located between the main body and the gold layer.

4. The pyramid bump structure in accordance with claim 1, wherein the oblique pyramid insulating layer reveals the gold layer.

5. The pyramid bump structure in accordance with claim 1, wherein the oblique pyramid insulating layer comprises an oxide layer and a nitride layer, the oxide layer is located between the conductive block and the nitride layer.

6. The pyramid bump structure of claim 1, further comprising a protecting layer covering portions of the carrier not covered by the bond pad and covering a lateral surface of the bond pad.

* * * * *